(12) United States Patent
Timm et al.

(10) Patent No.: US 10,825,976 B2
(45) Date of Patent: Nov. 3, 2020

(54) THERMOELECTRIC DEVICE AND METHODS FOR MANUFACTURE AND USE

(71) Applicant: Board of Trustees of Michigan State University, East Lansing, MI (US)

(72) Inventors: Edward J. Timm, Williamston, MI (US); Harold J. Schock, Brighton, MI (US); Guoming G. Zhu, Novi, MI (US); Trevor Ruckle, Haslett, MI (US); Kevin D. Moran, Trenton, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 541 days.

(21) Appl. No.: 15/328,145

(22) PCT Filed: Aug. 12, 2015

(86) PCT No.: PCT/US2015/044862
§ 371 (c)(1),
(2) Date: Jan. 23, 2017

(87) PCT Pub. No.: WO2016/025600
PCT Pub. Date: Feb. 18, 2016

(65) Prior Publication Data
US 2017/0222114 A1 Aug. 3, 2017

Related U.S. Application Data

(60) Provisional application No. 62/061,384, filed on Oct. 8, 2014, provisional application No. 62/036,304, filed on Aug. 12, 2014.

(51) Int. Cl.
*H01L 35/32* (2006.01)
*H01L 35/10* (2006.01)
*H01L 35/20* (2006.01)

(52) U.S. Cl.
CPC .............. *H01L 35/32* (2013.01); *H01L 35/10* (2013.01); *H01L 35/20* (2013.01)

(58) Field of Classification Search
CPC ......... H01L 35/10; H01L 35/20; H01L 35/30; H01L 35/32
See application file for complete search history.

(56) References Cited

U.S. PATENT DOCUMENTS 3,054,840 A   9/1962 Alsing
3,056,848 A * 10/1962 Meyers .................. H01L 35/00
                                                 136/210

(Continued)

FOREIGN PATENT DOCUMENTS

JP    04-229084 A    8/1992
JP    2003-110157 A  4/2003

(Continued)

OTHER PUBLICATIONS

Hu, Shih-Yung; "Heat Transfer Enhancement in Thermoelectric Power Generation," Graduate Theses and Dissertations, Paper 12196, 2009, 40 pages.

(Continued)

*Primary Examiner* — Mayla Gonzalez Ramos
(74) *Attorney, Agent, or Firm* — Harness, Dickey & Pierce, PLC

(57) ABSTRACT

A thermoelectric device (20) and a method for manufacturing and using the same are disclosed. The thermoelectric device (20) includes a hot shoe (24) and a cold shoe (28) disposed about the hot shoe. A heat conducting member (32) formed of a thermoelectric material extends between the hot shoe (24) and the cold shoe (28) and generates electricity in response to a temperature difference therebetween. The hot shoe (24) is heated and expands at a greater rate than the cold shoe (28) does during operation. The structural and spatial relationship of the hot shoe (24) and the cold shoe (28)

(Continued)

maintains the thermoelectric material of the heat conducting member (32) in compression during operation of the thermoelectric device (20).

28 Claims, 10 Drawing Sheets

(56) References Cited

U.S. PATENT DOCUMENTS

| | | | | |
|---|---|---|---|---|
| 3,481,794 | A * | 12/1969 | Kasschau | G21H 1/103 136/208 |
| 4,095,998 | A | 6/1978 | Hanson | |
| 6,894,215 | B2 * | 5/2005 | Akiba | H01L 35/30 136/204 |
| 8,495,884 | B2 | 7/2013 | Bell et al. | |
| 8,646,261 | B2 | 2/2014 | Meisner et al. | |
| 8,656,710 | B2 | 2/2014 | Bell et al. | |
| 8,716,589 | B2 | 5/2014 | Haass | |
| 2008/0289677 | A1 * | 11/2008 | Bell | H01L 35/26 136/236.1 |
| 2009/0133734 | A1 * | 5/2009 | Takahashi | H01L 35/22 136/230 |
| 2010/0186422 | A1 | 7/2010 | Yang et al. | |
| 2010/0229911 | A1 | 9/2010 | Leavitt et al. | |
| 2011/0023930 | A1 * | 2/2011 | Konig | H01L 35/08 136/212 |
| 2011/0258995 | A1 | 10/2011 | Limbeck et al. | |
| 2011/0314798 | A1 | 12/2011 | Limbeck et al. | |

FOREIGN PATENT DOCUMENTS

| | | |
|---|---|---|
| JP | 2012-74662 A | 4/2012 |
| JP | 2014-075542 A | 4/2014 |

OTHER PUBLICATIONS

Schock, Harold, et al.; "Prospects for Implementation of Thermoelectric Generators as Waste Heat Recovery Systems in Class 8 Truck Applications," Journal of Energy Resources Technology, vol. 135, Jun. 2013, pp. 022001-1-022001-9.

Schock, Harold, et al.; "Thermoelectric Conversion of Waste Heat to Electricity in an IC Engine Powered Vehicle," PowerPoint presentation, Sep. 30, 2009, pp. 1-28.

Short, Jarrod L., et al.; "Characterization of Thermoelectric Power Generation Modules Made from New Materials," Mater. Res. Soc. Symp. Proc, vol. 886, 2006, seven pages.

"Thermoelectric Conversion of Waste Heat to Electrictiy in an IC Engine Powered Vehicle," Final Report DEFC2604N42281, Michigan State University, Iowa State University, Northwestern University, NASA Jet Propulsion Laboratory, Cummins Engine Company, Apr. 30, 2011, pp. 1-177.

Office Action dated Jul. 3, 2018 in corresponding Japanese Application No. 2017-507389 with English translation.

Office Action dated Dec. 18, 2018 in corresponding Japanese Application No. 2017-507389 with English translation.

Office Action dated Aug. 24, 2018 in corresponding Chinese Application No. 201580043431.9 with English translation.

* cited by examiner

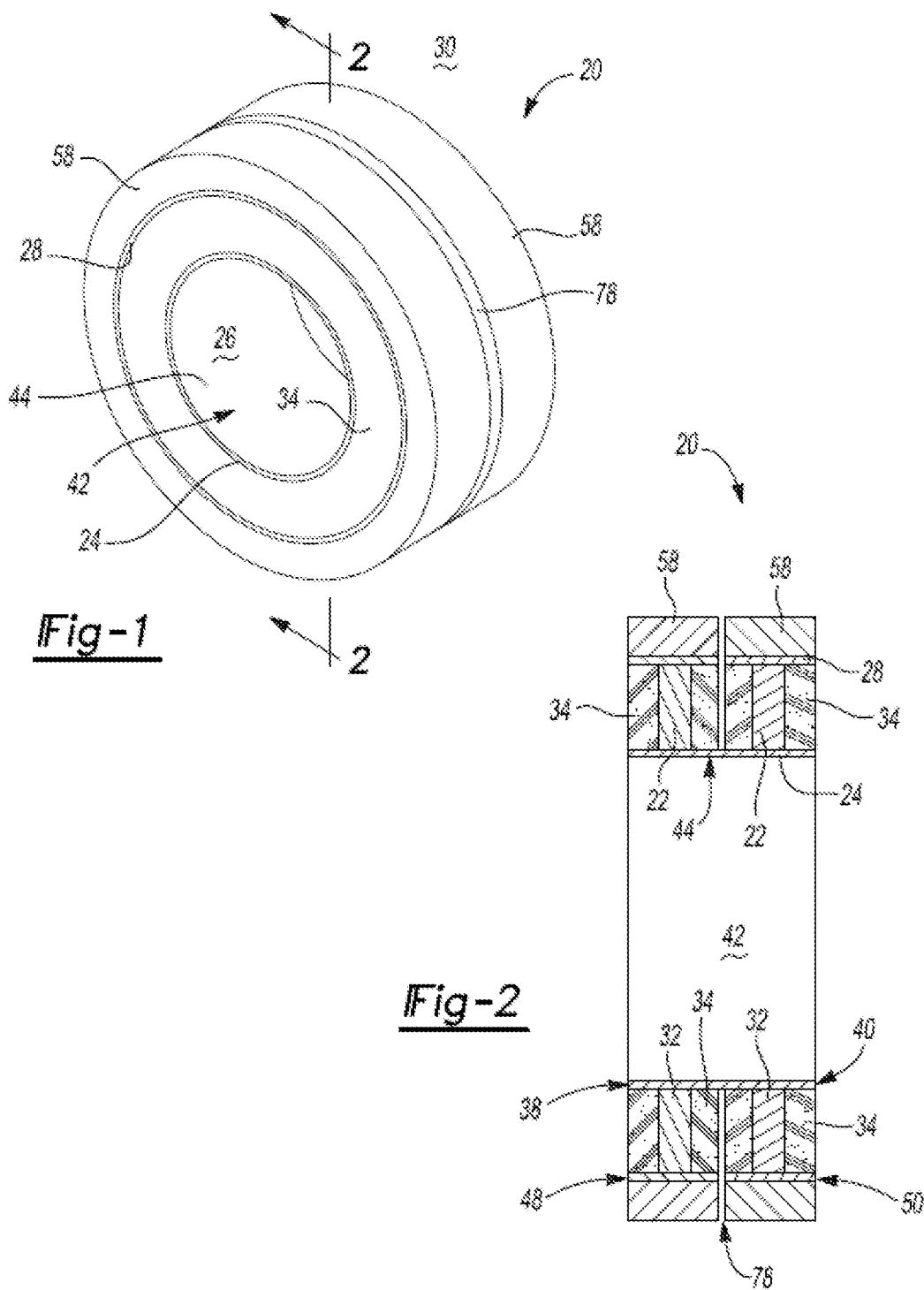

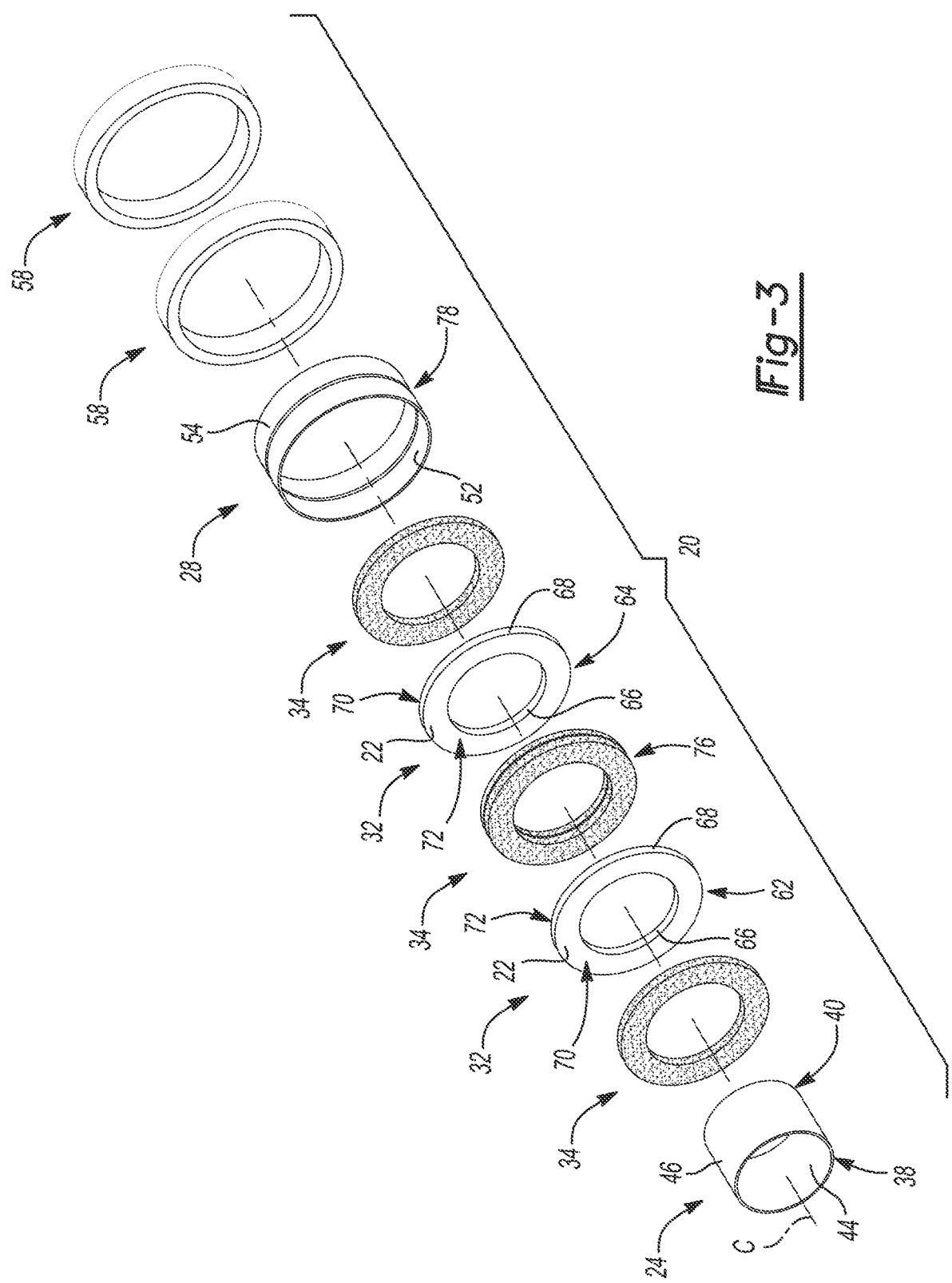

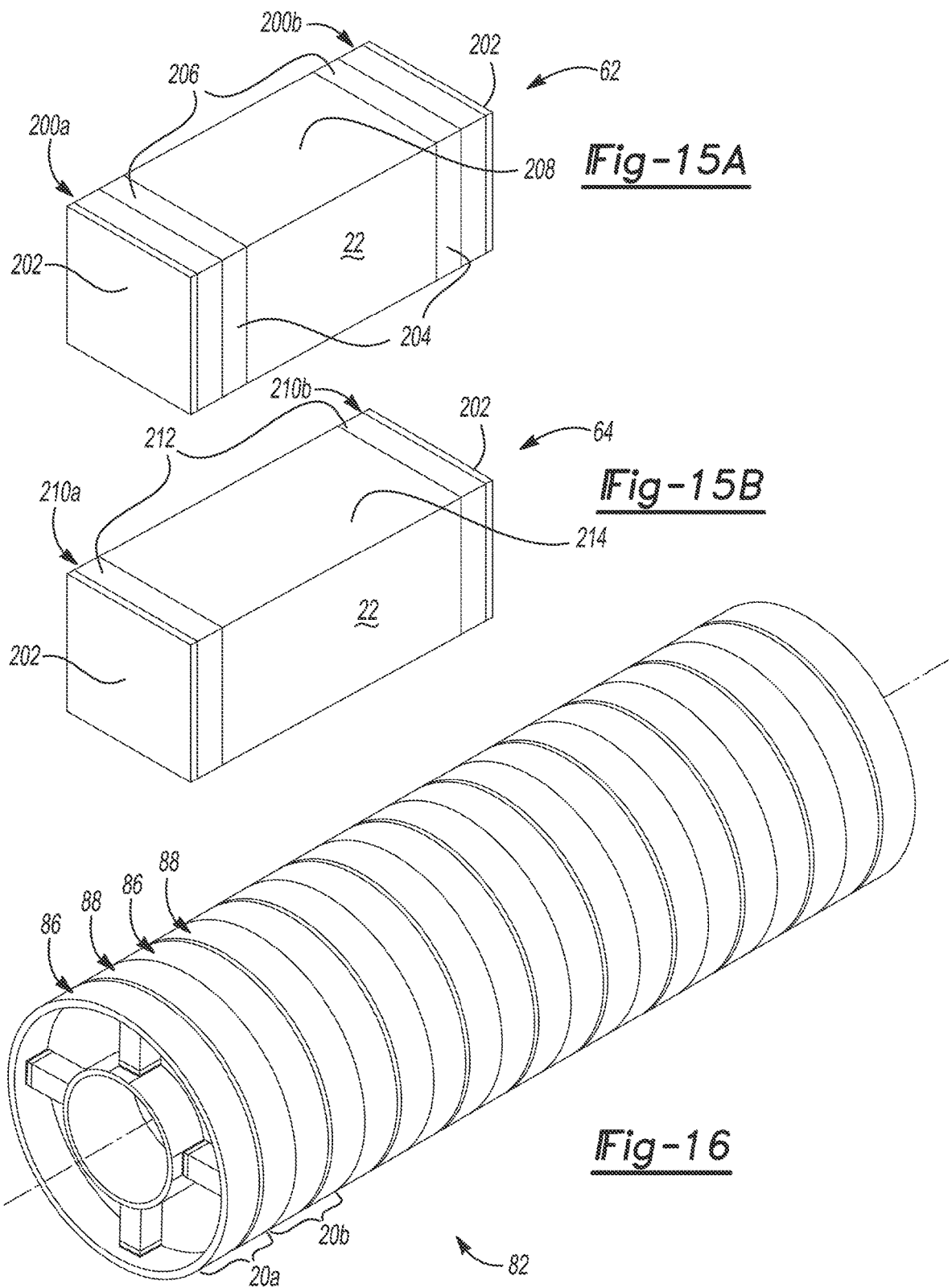

THERMOELECTRIC DEVICE AND METHODS FOR MANUFACTURE AND USE

CROSS REFERENCE TO RELATED APPLICATIONS

This application is a National Phase Entry of International Patent Application No. PCT/US2015/044862, filed on Aug. 12, 2015, which claims benefit of U.S. Provisional Application No. 62/061,384, filed on Oct. 8, 2014 and U.S. Provisional Application No. 62/036,304, filed on Aug. 12, 2014. The entire disclosures of the above applications are incorporated herein by reference.

FIELD

The subject disclosure describes an apparatus for a thermoelectric device. Methods for manufacturing the thermoelectric device and for generating electricity using the thermoelectric device are also disclosed.

BACKGROUND

This section provides background information related to the present disclosure which is not necessarily prior art.

With increasing emphasis on energy efficiency and alternative sources of energy, methods of energy generation and storage that increase efficiency and reduce cost are continuously being developed. One method of recovering otherwise wasted thermal energy is through the use of thermoelectric devices. Thermoelectric devices in general comprise a hot shoe disposed adjacent a heat source and a cold shoe disposed adjacent a heat sink. The hot shoe and the cold shoe are linearly aligned and spaced apart from one another. A pair of thermoelectric legs extends between the hot shoe and the cold shoe to thermally couple the hot shoe and cold shoe as part of a thermally conductive circuit. Together with the hot shoe and the cold shoe, the pair of thermoelectric legs form a thermoelectric couple. Furthermore, the thermoelectric legs are made from different thermoelectric materials that generate electricity in response to a temperature difference or temperature gradient across their length. The different thermoelectric materials used in the thermoelectric legs typically are semiconductors. For example, one thermoelectric material that can be used in each of the thermoelectric legs is comprised of skutterudite. The different response of each thermoelectric material used for the thermoelectric legs to the temperature gradient creates a current flow that can be harnessed to perform work. The amount of current generated depends not only upon the selection of the thermoelectric materials as semiconductors, but also upon the magnitude of the temperature gradient between the heat source and the heat sink and the contact interface between the pair of thermoelectric legs and the hot shoe and the cold shoe respectively.

While this technology enjoys a promising outlook, its application as a real world energy generator faces a major obstacle—long term reliability. A problem arises by virtue of the necessary construction of the thermoelectric device itself, which requires the use of different materials having different rates of thermal expansion. Since the materials used for the hot shoe, the cold shoe, and the pair of thermoelectric legs expand at different rates, conventional thermoelectric devices frequently fail due to a differential of thermal expansion in the materials at the interface of the thermoelectric legs and the hot shoe and the cold shoe. The frequency of these failures requires the individual thermoelectric devices to be connected in parallel as part of a thermoelectric module rather than in series to allow operation of the thermoelectric module after failure of one or more of the thermoelectric couples occurs. This arrangement is more costly, requires a more complicated control scheme, and the electronics take up more space within any particular application.

SUMMARY

An apparatus for a thermoelectric device is described in accordance with one aspect of the subject disclosure. The thermoelectric device generally includes a hot shoe disposed adjacent a heat source and a cold shoe disposed adjacent a heat sink. At least one heat conducting member extends between the hot shoe and the cold shoe to thermally couple the hot shoe and the cold shoe. The at least one heat conducting member generates electricity in response to a temperature difference between the hot shoe and the cold shoe. The cold shoe generally extends about the hot shoe. During operation of the thermoelectric device, the hot shoe expands at a greater rate than the cold shoe does because the hot shoe is heated by the heat source. As a result of the structural and spatial relationship between the hot shoe and the cold shoe, the at least one heat conducting member is compressed between the hot shoe and the cold shoe during operation of the thermoelectric device. It has been found that the resiliency of the material forming the at least one heat conducting member is improved when the material is kept under compression in comparison to neutral loading and/or tension. Thus, the disclosed thermoelectric device prevents failures of the at least one heat conducting member caused by thermal expansion.

In accordance with another aspect of the subject disclosure, the cold shoe extends annularly about the hot shoe forming an annular cavity between the hot shoe and the cold shoe. The at least one heat conducting member is disposed within the annular cavity and is radially compressed between the hot shoe and the cold shoe. In accordance with yet another aspect of the subject disclosure, the cold shoe extends co-axially about the hot shoe forming a cavity between the hot shoe and the cold shoe. The at least one heat conducting member is disposed within the cavity and includes a positive leg and a negative leg that generate electricity in response to a difference in temperature between the cold shoe and the hot shoe.

In accordance with yet another aspect of the subject disclosure, the thermoelectric device (for example, a thermoelectric coupling) includes a hot shoe and a cold shoe that extends about the hot shoe to form a cavity there between. A plurality of heat conducting members are disposed in the cavity between the hot shoe and the cold shoe. Each heat conducting member of the plurality of heat conducting members contains a thermoelectric material and extends outwardly from the hot shoe to the cold shoe. In accordance with this structural arrangement, the plurality of heat conducting members are compressed between the hot shoe and the cold shoe in response to greater thermal expansion of the hot shoe relative to the cold shoe during operation of the thermoelectric coupling. Accordingly, all of the disclosed arrangements advantageously maintain the heat conducting member(s) in compression during operation of the thermoelectric device or thermoelectric coupling.

A method for manufacturing a thermoelectric device is also described in accordance with another aspect of the subject disclosure. Advantageously, this method of manufacture produces a thermoelectric device where the thermoelectric material of the heat conducting member(s) is maintained in compression throughout operation of the thermoelectric device. Additionally, a method for generating electricity using a thermoelectric device is described in accordance with the subject disclosure.

Advantageously, the disclosed thermoelectric device and the methods for manufacturing and using the same, facilitates high heat flux through a thermoelectric device and provides optimal interfaces between the heat conducting member(s) and the hot shoe and the cold shoe. The disclosed thermoelectric device is superior to conventional designs because the disclosed construction does not suffer from thermal expansion related failures since the design maintains the thermoelectric material in compression between the hot shoe and the cold shoe during operation of the thermoelectric device and optionally when the thermoelectric device is inactive depending on the structural arrangement and size of the various components.

BRIEF DESCRIPTION OF THE DRAWINGS

The drawings described herein are for illustrative purposes only of selected embodiments and not all possible implementations, and are not intended to limit the scope of the present disclosure. Other advantages of the present invention will be readily appreciated, as the same becomes better understood by reference to the following detailed description when considered in connection with the accompanying drawings wherein:

FIG. 1 is a side perspective view of an exemplary thermoelectric device constructed in accordance with the subject disclosure;

FIG. 2 is a side cross-sectional view, taken along line 2-2 of FIG. 1 showing the exemplary thermoelectric device;

FIG. 3 is an exploded perspective view of the exemplary thermoelectric device of FIG. 1;

FIG. 15A is a side perspective view of an exemplary positive leg of the exemplary thermoelectric device of FIG. 13;

FIG. 15B is a side perspective view of an exemplary negative leg of the exemplary thermoelectric device of FIG. 13; and FIG. 16 is a side perspective view of multiple exemplary thermoelectric devices arranged adjacent to one another.

DETAILED DESCRIPTION

Figure 4:
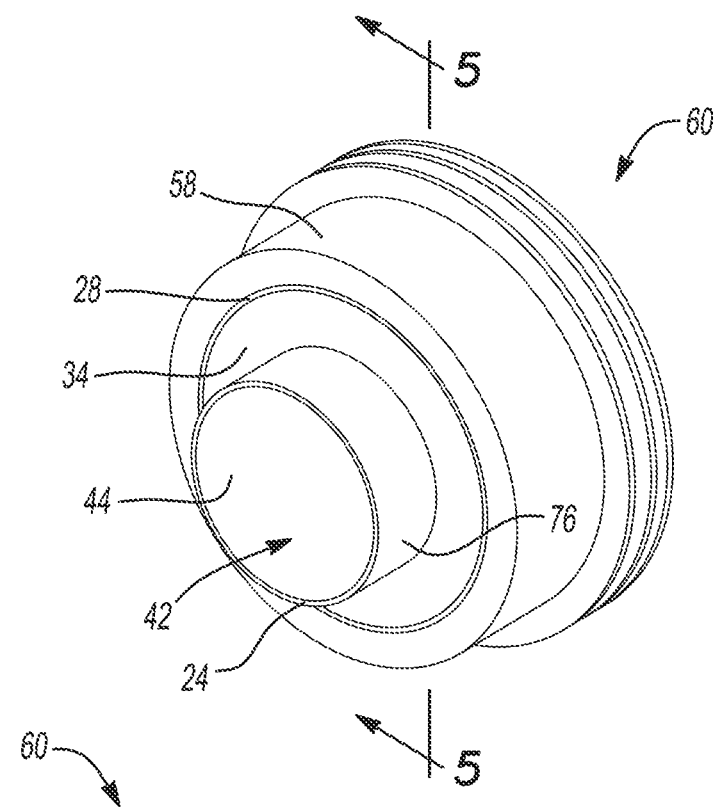
FIG. 4 is a side perspective view of another exemplary thermoelectric device constructed in accordance with the subject disclosure further including a cooling mechanism adjacent the cold shoe.

Referring to the Figures, wherein like numerals indicate corresponding parts throughout the several views, an apparatus for a thermoelectric device 20 is disclosed along with methods for manufacturing and using the same. Generally, thermoelectric device 20 generates electricity in response to a temperature differential or gradient applied to a thermoelectric material 22. Thus, it should be appreciated that such a thermoelectric device 20 may alternatively be referred to as a thermoelectric generator 20 or a thermoelectric couple 20.

Exemplary embodiments will now be described more fully with reference to the accompanying drawings. Exemplary embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. The method steps, processes, and operations described herein are not to be construed as necessarily requiring their performance in the particular order discussed or illustrated, unless specifically identified as an order of performance. It is also to be understood that additional or alternative steps may be employed.

Referring to FIG. 1, thermoelectric device 20 includes a hot shoe or heat receiving structure 24 disposed adjacent a heat source 26 and a cold shoe or heat dissipating structure 28 disposed adjacent a heat sink 30. Accordingly, there is a temperature difference or a temperature gradient between hot shoe 24 and cold shoe 28 where thermal energy flows to thermoelectric device 20 at hot shoe 24 and is dissipated from thermoelectric device 20 at cold shoe 28. Heat conducting member 32 extends between hot shoe 24 and cold shoe 28. Heat conducting member 32 thus thermally couples hot shoe 24 and cold shoe 28. Heat conducting member 32 is made from a thermoelectric material 22 such that it generates electricity in response to the temperature difference between hot shoe 24 and cold shoe 28. By way of example and without limitation, thermoelectric material 22 of heat conducting member 32 is a semi-conductor, which is at least partially comprised of skutterudite. Such skutterudite material is more specifically comprised of cobalt and antimony.

With reference to FIG. 2, insulating members 34 are disposed adjacent to and sandwich each heat conducting member 32, between hot shoe 24 and cold shoe 28. Insulating member 34 provides several functions. First, insulating members 34 electrically isolate each heat conducting member 32 and therefore prevents shorting. Second, insulating members 34 thermally insulate each heat conducting member 32. Third, insulating members 34 seal each heat conducting member 32 from the environment to reduce or eliminate corrosion and/or oxidation of thermoelectric material 22. While many different insulating materials may be used without departing from the scope of the present disclosure, insulating member 34 may be made of, for example, Macor, Mica, or other ceramic materials.

It can be seen in FIGS. 2 and 3 that hot shoe 24 extends annularly about a centerline C and axially between a first end 38 and a second end 40 thereof. Hot shoe 24 has a circular-cylindrical shape and defines a central bore 42 disposed therein. Hot shoe 24 thus presents an inner surface 44 that circumferentially bounds central bore 42 and an outer surface 46 that is opposite inner surface 44. Central bore 42 of hot shoe 24 is configured to receive heat source 26 such that inner surface 44 of hot shoe 24 contacts heat source 26 and receives thermal energy from heat source 26. Hot shoe 24 has an outer diameter OD1 that is measured across outer surface 46 of hot shoe 24 and an inner diameter ID1 that is measured across inner surface 44 of hot shoe 24.

The cold shoe 28 of the thermoelectric device 20 extends annularly and co-axially about the hot shoe 24 and axially between a first end 48 and a second end 50. Accordingly, the cold shoe 28 has a cylindrical shape presenting an inner surface 52 facing the hot shoe 24 and an outer surface 54 that is opposite the inner surface 52. The inner surface 52 of the cold shoe 28 is radially spaced from the outer surface 46 of the hot shoe 24 such that an annular cavity 56 is formed between the hot shoe 24 and the cold shoe 28. The cold shoe 28 has an outer diameter OD2 that is measured across the outer surface 54 of the cold shoe 28 and an inner diameter ID2 that is measured across the inner surface 52 of the cold shoe 28. The inner diameter ID2 of the cold shoe 28 is larger than the outer diameter OD1 of the hot shoe 24 such that the annular cavity 56 extends radially a predetermined gap distance G between the outer surface 46 of the hot shoe 24 and the inner surface 52 of the cold shoe 28. It should be appreciated that while the hot shoe 24 and the cold shoe 28 are described herein and illustrated in the figures as circular-cylindrical in shape, other shapes of the hot shoe 24 and/or the cold shoe 28 may be utilized without departing from the scope of the present disclosure, although some of the advantages of the subject thermoelectric device may not be realized if other shapes are utilized. Accordingly, the central bore 42 may or may not be cylindrical in shape and the central bore 42 may or may not be centered with respect to hot shoe 24.

During operation of the thermoelectric device 20, the hot shoe 24 is heated and therefore expands at a greater rate than the cold shoe 28. As a result of the hot shoe 24 being disposed within the cold shoe 28 with the at least one heat conducting member 32 spaced therebetween, expansion of the hot shoe 24 compresses the thermoelectric material 22 of the at least one heat conducting member 32 radially between the hot shoe 24 and the cold shoe 28. Thus, the at least one heat conducting member 32 is maintained in compression between the hot shoe and the cold shoe during operation of the thermoelectric device 20. The thermoelectric device 20 may additionally include at least one compression member 58 circumferentially stretched about the cold shoe 28 that applies additional compression to heat conducting members 32 via compression of the cold shoe 28 inwardly toward the hot shoe 24. Stated another way, compression member 58 exhibits an interference fit with the outer surface 54 of the cold shoe 28 such that the at least one compression member 58 applies radially inward pressure to the cold shoe 28. This advantageously maintains the thermoelectric material 22 of the at least one heat conducting member 32 in compression when the thermoelectric device 20 is at room temperature and inactive. While compression member 58 may be made of a variety of different materials, the compression member may be, by way of example and without limitation, one hundred percent brass, an alloy containing brass, or a compound containing brass as one of its constituents.

Figure 5:
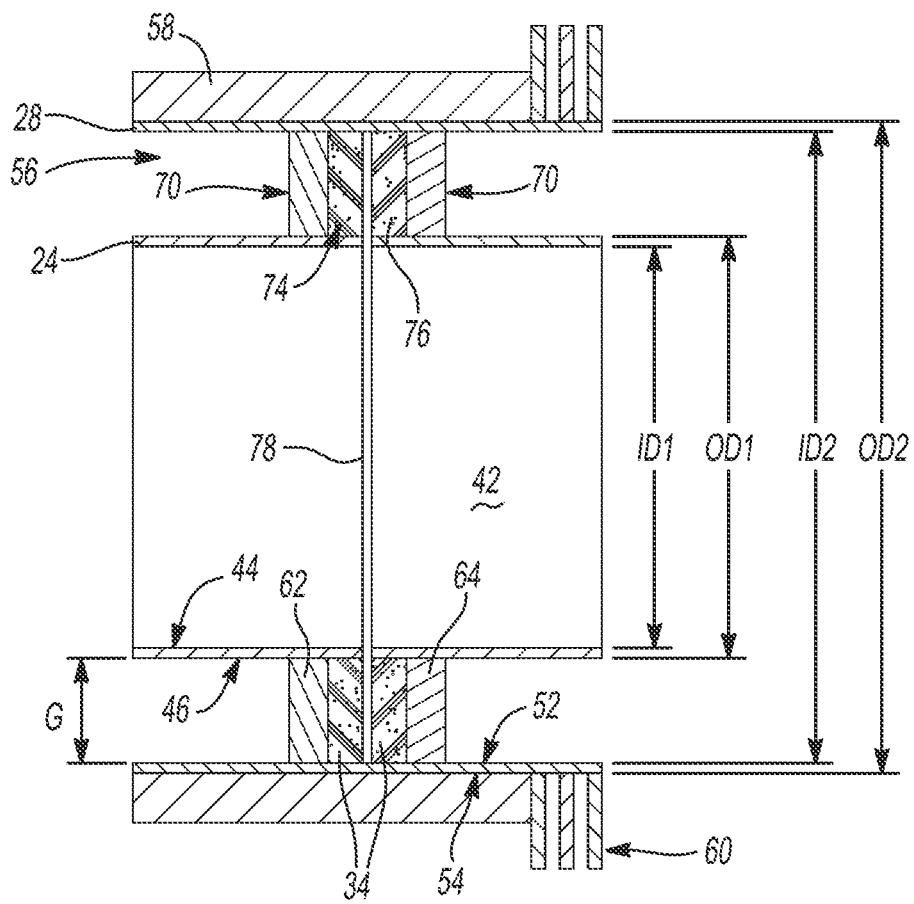
FIG. 5 is a side cross-sectional view, taken along line 5-5 of FIG. 4, showing the exemplary thermoelectric device.
Figure 6:
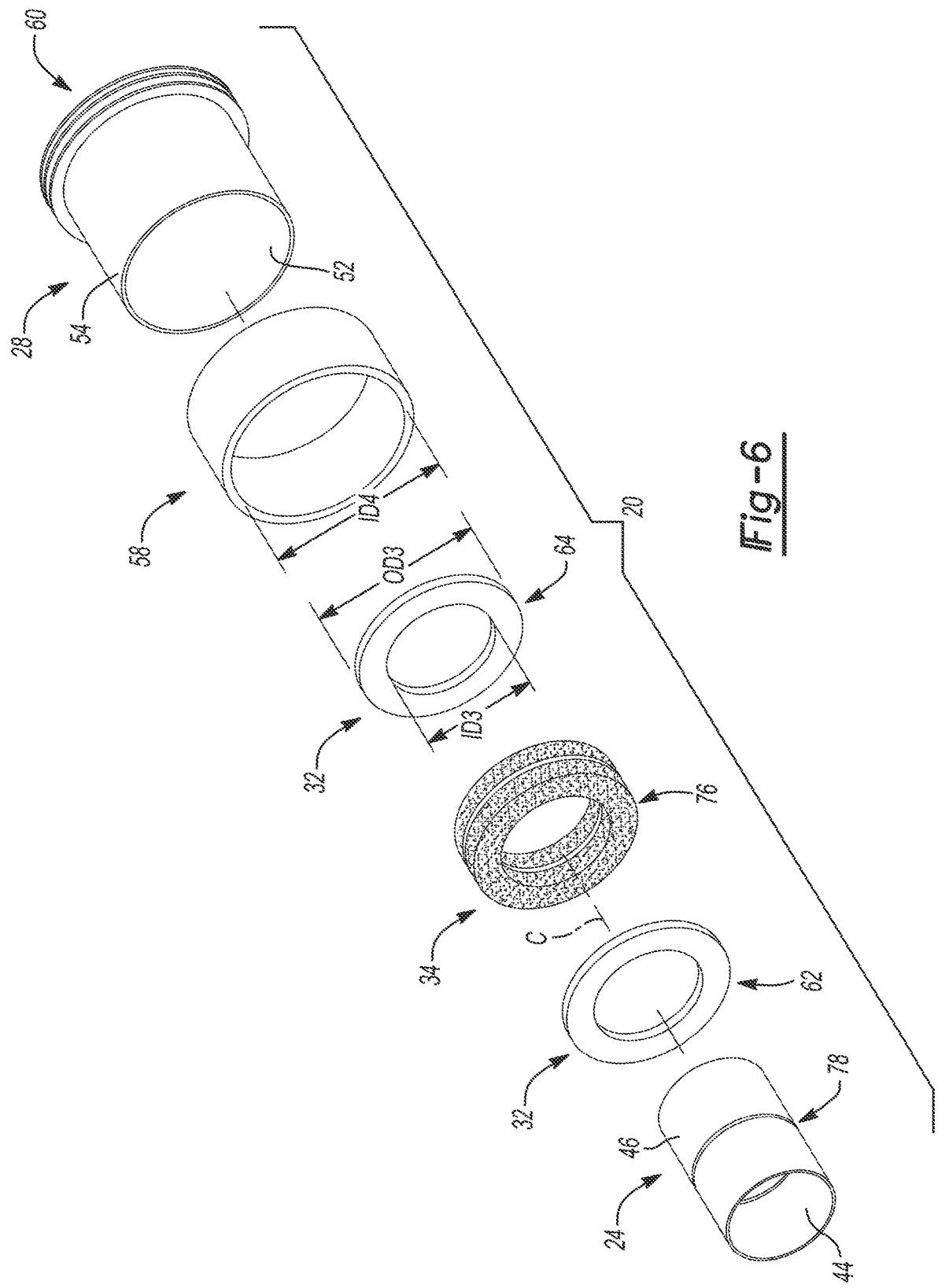
FIG. 6 is an exploded perspective view of the exemplary thermoelectric device of FIG. 4.

As shown in FIGS. 1-6, the outer surface 54 of the cold shoe 28 is exposed to a surrounding environment such that the cold shoe 28 dissipates thermal energy or heat from the thermoelectric device 20. By way of example and without limitation, the outer surface 54 of the cold shoe 28 is exposed to air such that convection carries heat away from the cold shoe 28 during operation of the thermoelectric device 20. In this way, the surrounding environment itself acts as the heat sink 30. FIG. 4 shows cold shoe 28 alternatively connected to a cooling mechanism 60 that draws heat away from the cold shoe 28. The cooling mechanism 60 is a structural component that may generally be integral with or attached to the outer surface 54 of the cold shoe 28. By way of example and without limitation, the cooling mechanism 60 could be a plurality of cooling fins, cooling ducts communicating a cooling fluid, a fan, thermally conductive wires, or a thermally conductive plate. In this configuration, the cooling mechanism 60 and/or the surrounding environment itself acts as the heat sink 30. In FIGS. 4-6, the cooling mechanism 60 is illustrated as a series of three annular fins extending from the cold shoe 28. The annular fins of the cooling mechanism 60 are axially spaced such that air flow between the annular fins cools the cold shoe 28 by convection. Of course, this construction of the cooling mechanism 60 is merely exemplary and many other arrangements are possible.

Both the hot shoe 24 and the cold shoe 28 may be made of the same material. For example and without limitation, the hot shoe 24 and the cold shoe 28 may be made of one hundred percent titanium, an alloy of titanium, or a compound containing titanium as one of its constituents. Titanium has been found to be particularly suitable for both the hot shoe 24 and the cold shoe 28 because titanium expands at roughly the same rate as skutterudite during heating. Accordingly, the bond between the hot shoe 24 and the at least one heat conducting member 32 and the bond between the cold shoe 28 and the at least one heat conducting member 32 are less likely to crack or otherwise separate. Titanium is also chemically compatible with skutterudite. The skutterudite could lose the ability to conduct electricity if other non-compatible materials were used for the hot shoe 24 and the cold shoe 28. Alternatively, the hot shoe 24 and the cold shoe 28 may be made of different materials but may not achieve the preferred advantages. For example, the hot shoe 24 may be made of a first material having a first thermal expansion coefficient. It should be appreciated that such a thermal expansion coefficient is a numerical value that quantifies the rate at which a material expands in volume in response to the application of a known and predetermined amount of thermal energy or heat. The cold shoe 28 may be made of a second material having a second thermal expansion coefficient that is less than the first thermal expansion coefficient such that the hot shoe 24 expands at a greater rate when heated than the cold shoe 28. Advantageously, this maintains the at least one heat conducting member 32 disposed in the annular cavity 56 between the hot shoe 24 and the cold shoe 28 in compression during operation of the thermoelectric device 20.

The at least one heat conducting member 32 includes a positive leg 62 and a negative leg 64. The positive leg 62 and the negative leg 64 each extend radially between an inner circumference 66 and an outer circumference 68 and axially between a distal end 70 and a proximal end 72. When the thermoelectric device 20 is assembled, the inner circumference 66 of the positive leg 62 and the inner circumference 66 of the negative leg 64 abut the outer surface 46 of the hot shoe 24. Similarly, the outer circumference 68 of the positive leg 62 and outer circumference 68 of the negative leg 64 abut the inner surface 52 of the cold shoe 28. The proximal end 72 of the positive leg 62 is axially spaced from and faces the proximal end 72 of the negative leg 64 to form an annular chamber 74 therebetween. The insulating member 34 is disposed in the annular chamber 74. The positive leg 62 and the negative leg 64 may have slightly different compositions of thermoelectric material 22 such that heat across the positive leg 62 and the negative leg 64 produce reverse electron flows. By way of example and without limitation, the positive leg 62 may be made of skutterudite containing cobalt, antimony, iron, and cerium while the negative leg 64 may be made of skutterudite containing cobalt, antimony, ytterbium, and barium.

The insulating member 34 further defines an annular gap 76 within the annular chamber 74 between the positive leg 62 and the negative leg 64. This annular gap 76 is formed as a narrow disc-shaped space in the insulating member 34 that is approximately halfway between the proximal end 72 of the positive leg 62 and the proximal end 72 of the negative leg 64 when measured along the axial direction. With reference to FIGS. 1-3, the cold shoe 28 of the thermoelectric device 20 may define an annular slot 78 that is axially aligned with the annular gap 76 of the insulating member 34. In this way, the annular gap 76 is open to the annular slot 78 and thus the environment surrounding the cold shoe 28. With reference to FIGS. 4-6, the hot shoe 24 of the thermoelectric device 20 may alternatively define the annular slot 78. Again, the annular slot 78 is axially aligned with the annular gap 76 of the insulating member 34. In this configuration, the annular gap 76 is open to the annular slot 78 and thus the central bore 42 of the hot shoe 24. In both configurations, the annular slot 78 creates a discontinuity such that electricity cannot flow between the positive and negative legs 62, 64 via the cold shoe 28 in FIGS. 1-3 and the hot shoe 24 in FIGS. 4-6. This prevents shorting of the thermoelectric couple 20.

FIGS. 4-6 specifically illustrate compression member 58 of thermoelectric device 20 as a pair of compression members 58 that each extend circumferentially about the cold shoe 28 on opposite sides of the annular slot 78. Accordingly, one of the compression members 58 compresses the positive leg 62 of the thermoelectric couple 20 and the other one of the compression members 58 compresses the negative leg 64 of the thermoelectric couple 20.

Figure 7:
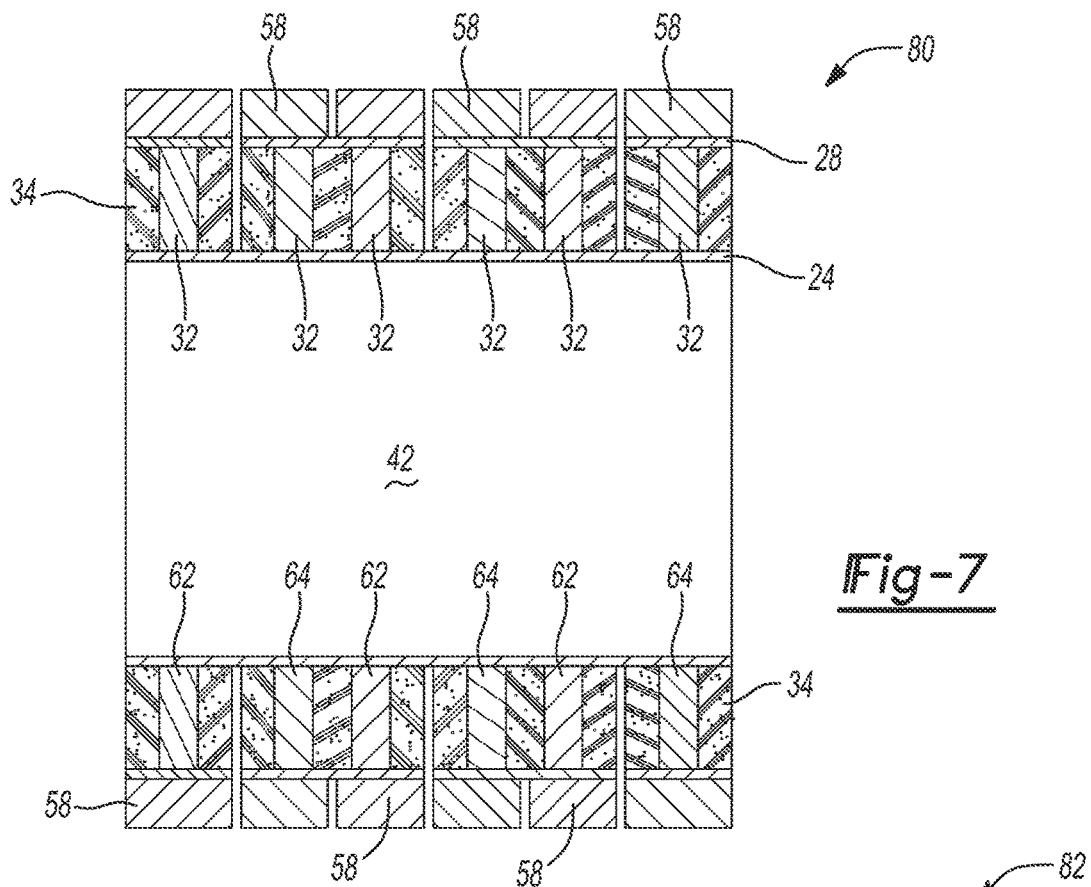
FIG. 7 is a side cross-sectional view of another exemplary thermoelectric device constructed in accordance with the subject disclosure wherein multiple heat conducting members are axially spaced along the annular cavity disposed between the hot shoe and the cold shoe.
Figure 8:
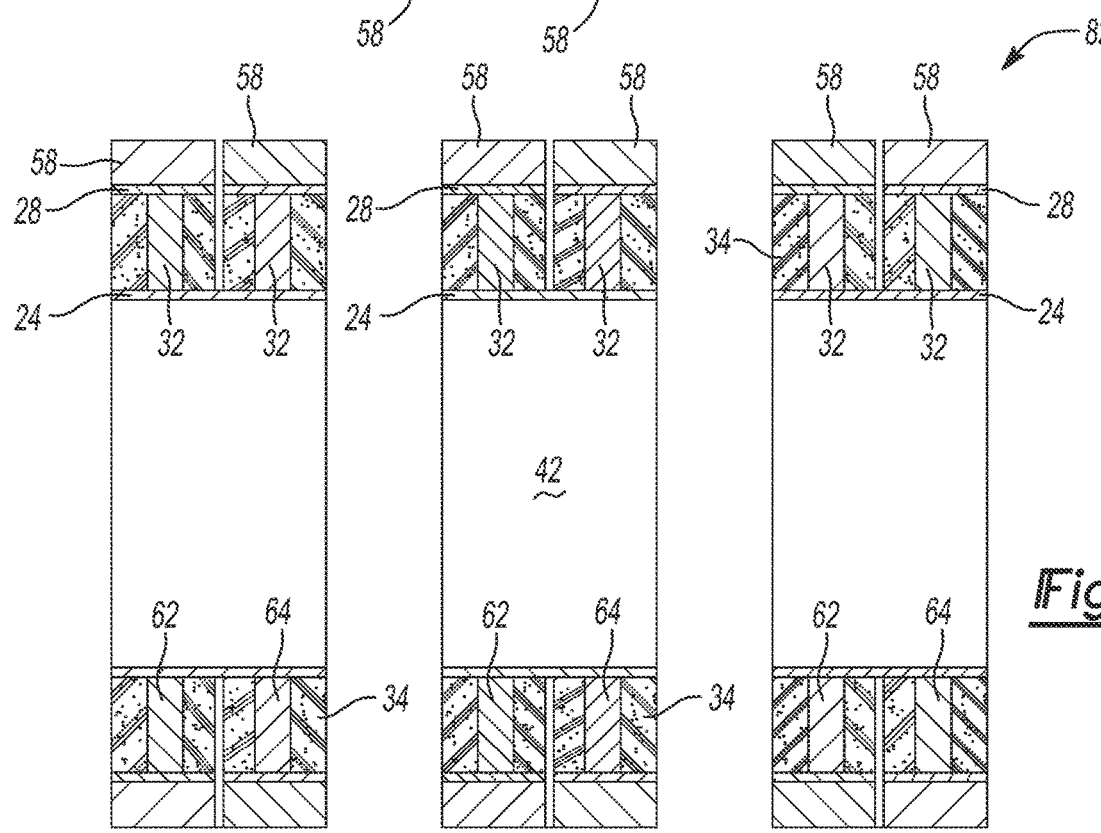
FIG. 8 is a side cross-sectional view of multiple exemplary thermoelectric devices arranged adjacent to one another.

With reference now to FIG. 7, a plurality of heat conducting members 32 are spaced along the annular cavity 56 formed between the hot shoe 24 and the cold shoe 28. As such, the plurality of heat conducting members 32 forms a thermoelectric network 80. As shown in FIG. 8, multiple thermoelectric devices 20 are arranged adjacent to one another to form a thermoelectric module 82. It should be appreciated that the multiple thermoelectric devices 20 in the thermoelectric module 82 can be wired in series or in parallel with one another to achieve various desired electrical outputs. For example, the multiple thermoelectric devices 20 of the thermoelectric module 82 can be wired in series to increase the voltage output of the thermoelectric module 82. Alternatively, the multiple thermoelectric devices 20 of the thermoelectric module 82 can be wired in parallel to increase the current output of the thermoelectric module 82.

Figure 9:
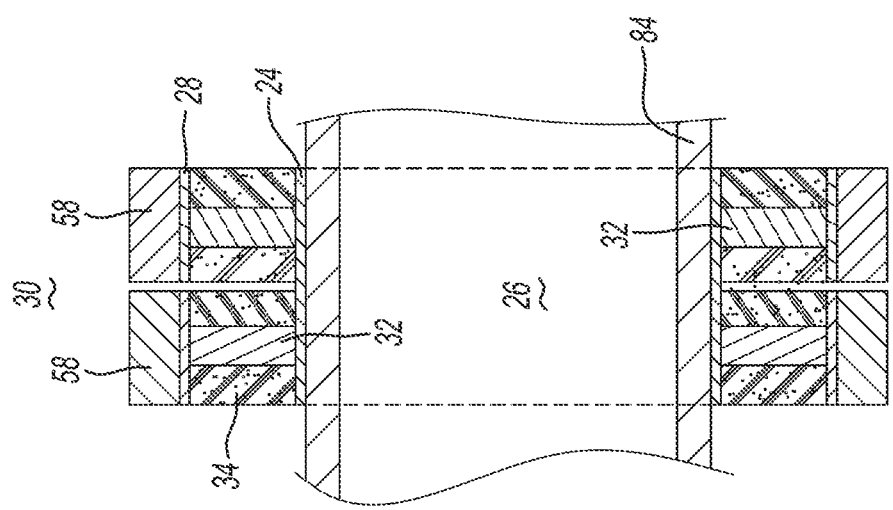
FIG. 9 is a side cross-sectional view of the exemplary thermoelectric device of FIG. 4 installed on an exemplary exhaust pipe.

FIG. 9 shows thermoelectric device 20 connected to and disposed about a tube 84. More particularly, the tube 84 illustrated in FIG. 9 is an exhaust pipe 84. The exhaust pipe 84 is connected in fluid communication with an internal combustion engine such that hot exhaust gases flow through the exhaust pipe 84 (i.e. the tube 84). It should be appreciated that the disclosed thermoelectric device 20 has a broad range of applications and that FIG. 9 is merely exemplary of one of these applications. Further, it should be understood that the term tube 84, as used herein, encompasses all fluid carrying structures, including without limitation, pipes, hoses, cylinders, passages, vessels, and valve bodies. As illustrated in FIG. 9, the central bore 42 of the hot shoe 24 receives a tube 84 configured to communicate a fluid therethrough. The fluid may be heated such that the inner surface 44 of the hot shoe 24 receives or draws thermal energy from the tube 84 (i.e. the hot shoe 24 is heated by the fluid in the tube 84). In accordance with this aspect of the disclosure, the thermoelectric device 20 advantageously can be used to generate electricity from the hot exhaust gases produced by the internal combustion engine. The hot exhaust gases heat the exhaust pipe 84 which in turn heats the hot shoe 24 of the thermoelectric device 20. Some of the thermal energy of the exhaust gases is thus harnessed for the useful purpose of generating electricity. This electricity may thus be used for powering electronics. The thermal energy harnessed by the disclosed thermoelectric device 20 is otherwise unutilized and is wasted when the exhaust gases are expelled from the exhaust pipe 84 into the environment. It should also be appreciated that the disclosed thermoelectric device 20 may be used with any internal combustion engine, including without limitation, spark ignition engines (e.g. gasoline engines) and compression ignition engines (e.g. diesel engines) of an automotive vehicle.

Figure 10:
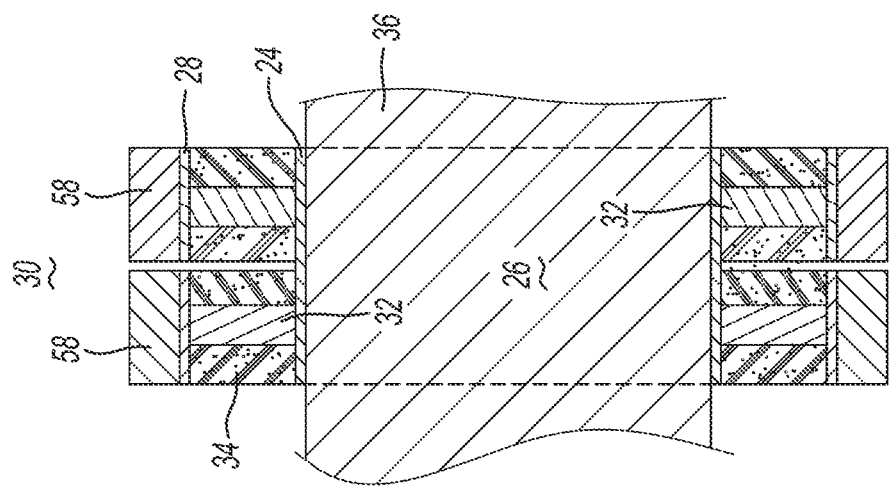
FIG. 10 is a side cross-sectional view of the exemplary thermoelectric device of FIG. 4 installed on an exemplary radioactive rod.

As shown in FIG. 10, it is also envisioned that the disclosed thermoelectric device 20 could be used to generate electricity from nuclear or radioactive material 36. Radioactive decay produces heat. A fissile material 36 may be placed within the central bore 42 of the hot shoe 24 such that the inner surface of the hot shoe 24 receives thermal energy from the fissile material 36. By way of example and without limitation, the fissile material 36 could be a radioactive rod 36 such as a nuclear fuel rod 36 in a stationary or ship-board power plant.

Figure 11:
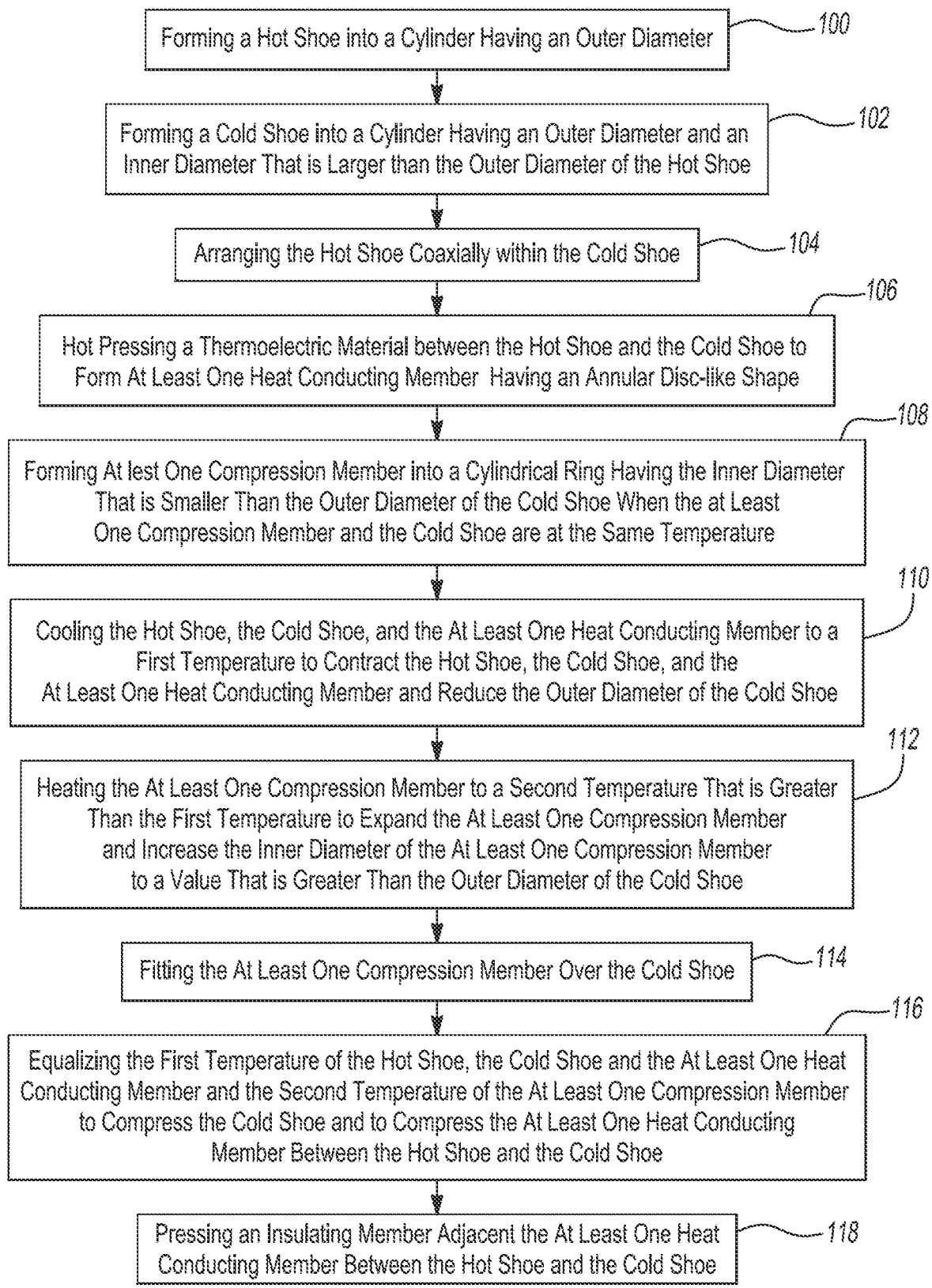
FIG. 11 is a flow diagram illustrating the steps of an exemplary method for manufacturing a thermoelectric device in accordance with the subject disclosure.

With reference to FIG. 11, the subject disclosure further provides a method for manufacturing the thermoelectric device 20 described above. The method includes step 100 of creating a hot shoe 24 of cylindrical shape having an outer diameter OD1. As explained above, the outer diameter OD1 of the hot shoe 24 is measured across the outer surface 46 of the hot shoe 24. In accordance with step 100 of the method, the hot shoe 24 is created from a material that is at least partially comprised of titanium. Thus, the hot shoe 24 may be formed of a material that is, for example, pure titanium, a titanium alloy, or a compound containing titanium as one of its constituents. Step 102 of the method includes creating a cold shoe 28 of cylindrical shape having an outer diameter OD2 and an inner diameter ID2 that is larger than the outer diameter OD1 of the hot shoe 24. As explained above, the outer diameter OD2 of the cold shoe 28 is measured across the outer surface 54 of the cold shoe 28 and the inner diameter ID2 of the cold shoe 28 is measured across the inner surface 52 of the cold shoe 28. In accordance with step 102 of the method, the cold shoe 28 is also created from a material that is at least partially comprised of titanium. Thus, the cold shoe 28 may be formed of a material that is, for example, one hundred percent titanium, an alloy containing titanium, or a compound containing titanium as one of its constituents.

Step 104 of the method includes inserting the hot shoe 24 coaxially within the cold shoe 28. Step 106 of the method includes hot pressing a thermoelectric material between the hot shoe 24 and the cold shoe 28 to form at least one heat conducting member 32. Accordingly, the at least one heat conducting member 32 formed in accordance with Step 106 has an annular disc-like shape and an inner diameter ID3 and an outer diameter OD3. It should be appreciated that the term "creating" as used herein to describe the manufacture of the disclosed thermoelectric device generally includes "to make." Thus, the term "creating" encompasses a broad range of manufacturing operations, including without limitation, cutting, machining, forming, extruding, forging, pressing, and stamping. Further, the term "hot pressing" includes an exemplary process where thermoelectric material, which may be in powdered form, is poured into the annular cavity 56 formed between the hot shoe 24 and the cold shoe 28. Dies apply pressure and heat to the thermoelectric material, which bonds to itself and the inner surfaces 44, 52 of the hot shoe 24 and the cold shoe 28.

Step 108 of the method includes creating at least one compression member 58 having cylindrical ring-like shape and an inner diameter ID4 that is smaller than the outer diameter OD2 of the cold shoe 28 when compression member 58 and the cold shoe 28 are at the same temperature. Step 110 of the method includes cooling the hot shoe 24, the cold shoe 28, and heat conducting member 32 to a first temperature to contract the hot shoe 24, the cold shoe 28, and heat conducting member 32. In accordance with Step 110, this cooling of the hot shoe 24, the cold shoe 28, and heat conducting member 32 as a subassembly reduces the outer diameter OD2 of the cold shoe. It should be appreciated that the term "cooling" as used herein is inclusive of, but not limited to, cooling by placing a hot part in a room temperature environment to sit and cool down to room temperature. Step 112 of the method includes heating compression member 58 to a second temperature that is greater than the first temperature to expand compression member 58. In accordance with Step 112, this heating of compression member 58 increases the inner diameter ID4 of compression member 58 to a value that is greater than the outer diameter OD2 of the cold shoe 28. Step 114 of the method proceeds with fitting t compression member 58 over the cold shoe 28. Thus, in accordance with Step 114, compression member 58 is placed around the outer surface 54 of the cold shoe 28. The method proceeds to Step 116 of equalizing the first temperature of heat conducting member 32 and the second temperature of compression member 58 to compress the cold shoe 28 inwardly and to compress heat conducting member 32 between the hot shoe 24 and the cold shoe 28. In accordance with Step 116 of the method, heat conducting member 32 is held in compression between the hot shoe 24 and the cold shoe 28 of the thermoelectric device 20. Advantageously, the thermoelectric material of heat conducting member 32 is less prone to failure as a result of thermal stresses when held in compression such that the durability of the thermoelectric device 20 is improved.

The method may optionally include Step 118 of pressing an insulating member 34 adjacent the heat conducting member 32. In accordance with Step 118, the insulating member 34 may be installed within the annular cavity 56 of the thermoelectric device 20 located between the hot shoe 24 and the cold shoe 28, on either side of heat conducting member 32, or both. It should be appreciated that the insulating member 34 may or may not be installed adjacent heat conducting member 32 prior to Step 114 of fitting compression member 32 over the cold shoe 28 and Step 116 of equalizing the first temperature and the second temperature to compress heat conducting member 32 between the hot shoe 24 and the cold shoe 28. Thus, the insulating member 34 may or may not be compressed between the hot shoe 24 and the cold shoe 28 as a result of equalizing the first and second temperatures in accordance with Step 116.

Figure 12:
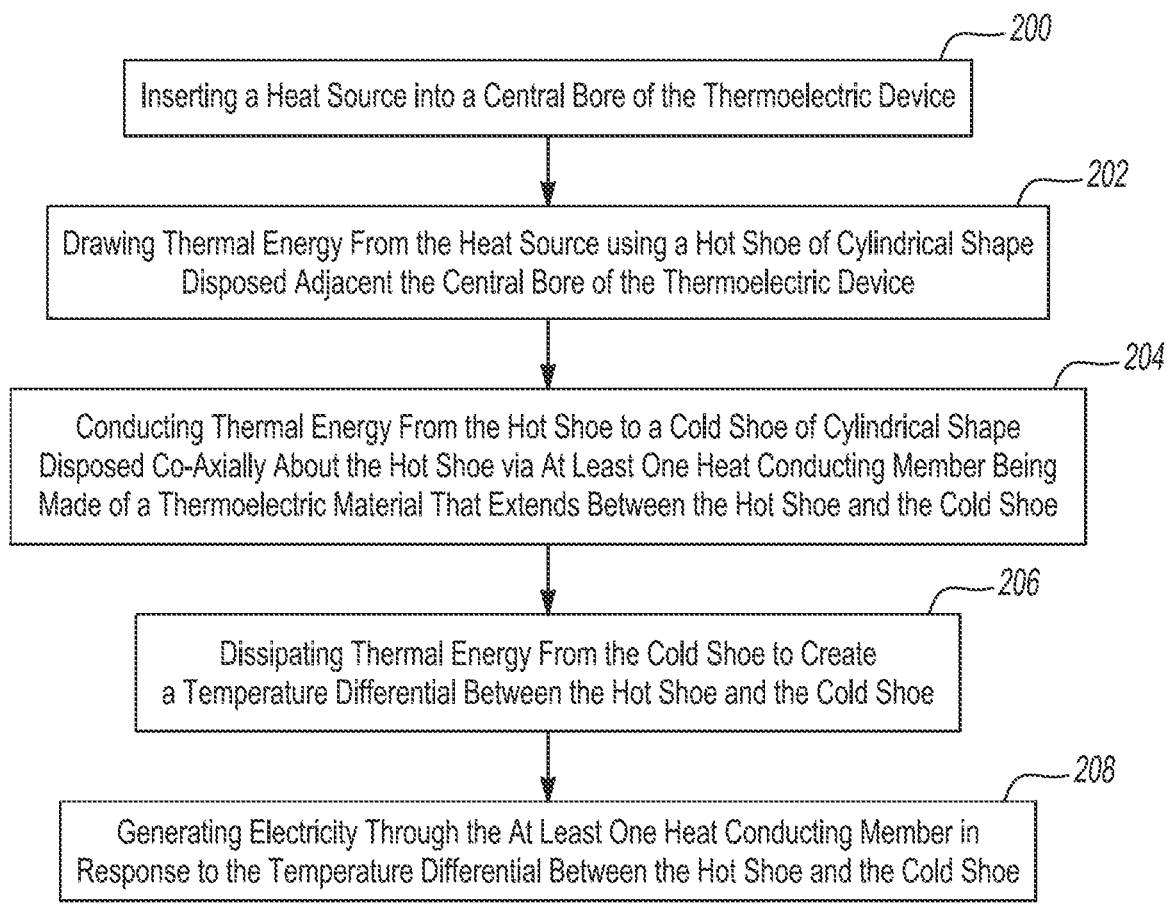
FIG. 12 is a flow diagram illustrating the steps of an exemplary method for generating electricity using a thermoelectric device in accordance with the subject disclosure.

With reference to FIG. 12, the subject disclosure further provides a method for generating electricity using a thermoelectric device 20. The method includes Step 200 of inserting a heat source 26 within a central bore 42 of the thermoelectric device 20. Step 202 of the method includes drawing thermal energy from the heat source 26 using a hot shoe 24 of cylindrical shape disposed adjacent the central bore 42 of the thermoelectric device 20. Step 204 proceeds with conducting thermal energy from the hot shoe 24 to a cold shoe 28 of cylindrical shape disposed co-axially about the hot shoe 24 via heat conducting member 32. In accordance with Step 204 of the method, heat conducting member 32 is made of a thermoelectric material that extends between the hot shoe 24 and the cold shoe 28. Step 206 of the method includes dissipating thermal energy from the cold shoe 28 to create a temperature differential between the hot shoe 24 and the cold shoe 28 and Step 208 of the method includes generating electricity through heat conducting member 32 in response to the temperature differential between the hot shoe 24 and the cold shoe 28. In accordance with these steps, it should be appreciated that the disclosed thermoelectric device 20 generates electricity from thermal energy or heat that the thermoelectric device 20 absorbs from the central bore 42. In other words, the thermoelectric device 20 may be used to convert thermal energy that is applied to the central bore 42 of the hot shoe 24 into electricity.

Figure 13:
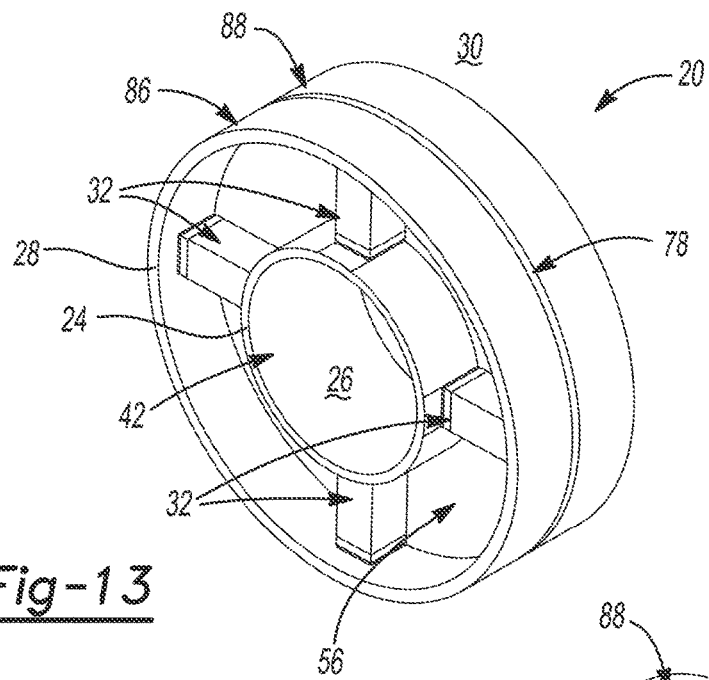
FIG. 13 is a side perspective view of another exemplary thermoelectric device constructed in accordance with the subject disclosure.
Figure 14:
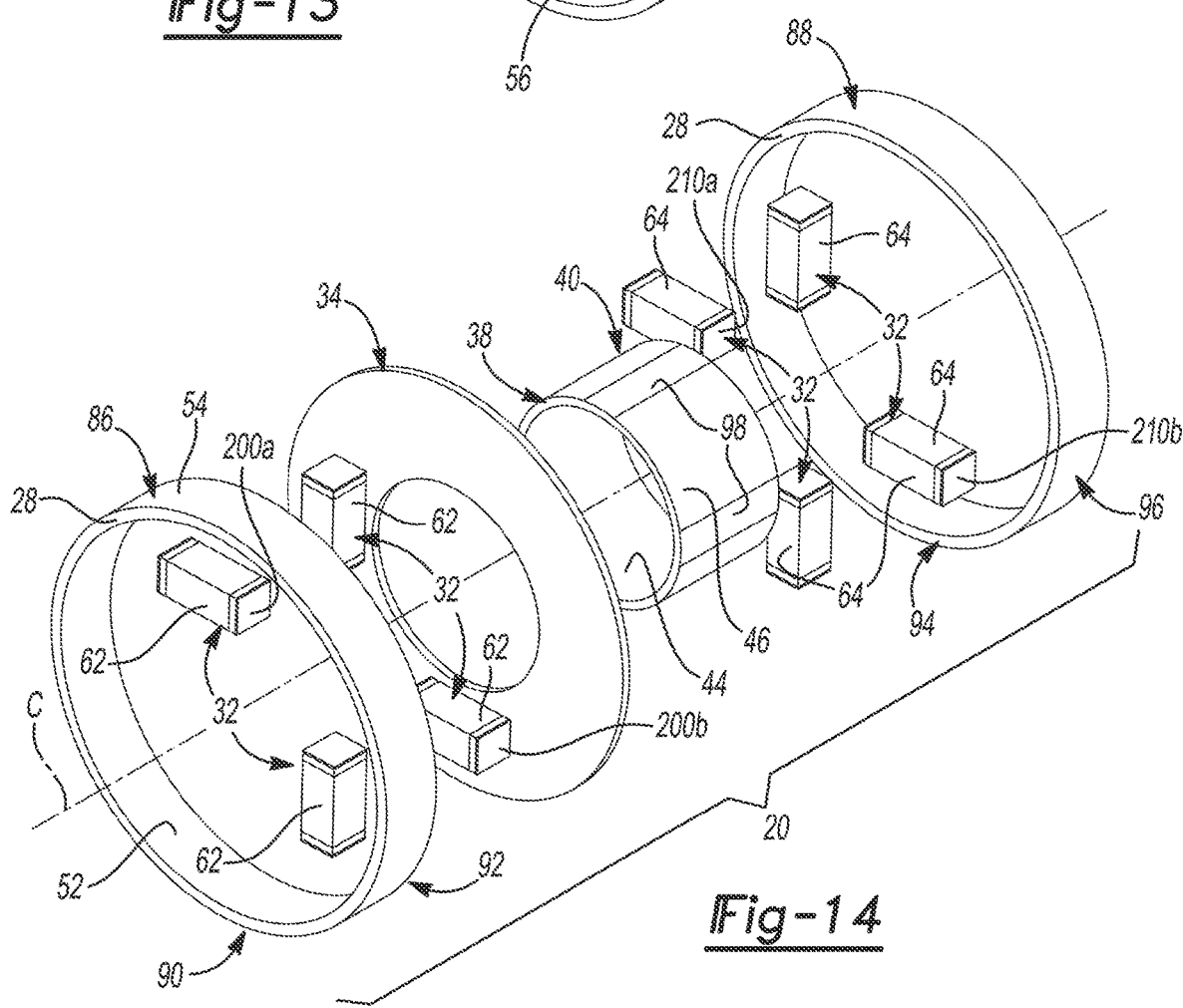
FIG. 14 is an exploded perspective view of the exemplary thermoelectric device of FIG. 13.

With reference to FIGS. 13-16 generally, an alternative construction for a thermoelectric coupling 20 is disclosed. As shown in FIGS. 13 and 14, the thermoelectric coupling 20 includes a hot shoe 24 disposed adjacent a heat source 26 and a cold shoe 28 disposed a heat sink 30. The hot shoe 24 extends annularly about a centerline C and axially between a first end 38 and second end 40. Although a variety of different shapes may be employed, the hot shoe 24 in FIGS. 13 and 14 has a circular-cylindrical shape defining a central bore 42 therein. Accordingly, the hot shoe 24 presents an inner surface 44 that circumferentially bounds the central bore 42 and an outer surface 46 that is opposite the inner surface 44.

The cold shoe 28 generally extends about the hot shoe 24 forming a cavity 56 between the cold shoe 28 and the hot shoe 24. Although the cold shoe 28 may have variety of different shapes, by way of example and without limitation, the cold shoe 28 preferably has a circular-cylindrical shape. As seen in FIGS. 13 and 14, the cold shoe 28 presents an inner surface 52 and an outer surface 54 that is opposite the inner surface 52. The cold shoe 28 co-axially arranged about the hot shoe 24 such that the cavity 56 is formed between the outer surface 46 of the hot shoe 24 and the inner surface 52 of the cold shoe 28. It should be appreciated that while the hot shoe 24 and the cold shoe 28 may be formed of a variety of different materials, by way of example and without limitation, the hot shoe 24 may be made of a material containing titanium and the cold shoe 28 may be made of a material containing brass.

As best seen in FIG. 14, the cold shoe 28 includes a first portion 86 and a second portion 88, each having a cylindrical shape. The first portion 86 and the second portion 88 of the cold shoe 28 are aligned with one another and are axially spaced to define an annular slot 78 therebetween. The first portion 86 of the cold shoe 28 extends axially between a first end 90 and a second end 92 that is opposite the first end 90 and the second portion 88 of the cold shoe 28 extends axially between a third end 94 and a fourth end 96 that is opposite the third end 94. The second end 92 of the cold shoe 28 and the third end 94 of the cold shoe 28 face each other and therefore define the annular slot 78 extending between the first portion 86 of the cold shoe 28 and the second portion 88 of the cold shoe 28. As shown in FIG. 13, the first end 90 of the cold shoe 28 may be axially aligned with the first end 38 of the hot shoe 24. Similarly, the fourth end 96 of the cold shoe 28 may be axially aligned with the second end 40 of the hot shoe 24 such that the hot shoe 24 and the cold shoe 28 are coextensive in overall length.

The thermoelectric coupling 20 further includes an insulating member 34 that is positioned axially between the first portion 86 of the cold shoe 28 and the second portion 88 of the cold shoe 28. As shown in FIG. 13, the insulating member 34 extends radially between the outer surface 46 of the hot shoe 24 and the outer surface 54 of the cold shoe 28 such that the insulating member 34 extends into and fills the annular slot 78 defined between the first portion 86 of the cold shoe 28 and the second portion 88 of the cold shoe 28. As a result, the second end 92 and the third end 94 of the cold shoe 28 may directly contact the insulating member 34 in an abutting relationship. As best seen in FIG. 14, the insulating member 34 may thus have a disc shape. Accordingly, the insulating member 34 electrically isolates the first portion 86 of the cold shoe 28 from the second portion 88 of the cold shoe 28. Although the insulating member 34 may be made of a variety of different materials, by way of example and without limitation, the insulating member 34 may be made of a material containing Mica. It should also be appreciated that the annular slot 78 may alternatively be formed in the hot shoe 24 instead of the cold shoe 28 such that the hot shoe 24 is split into two portions. In such a configuration, the insulating member 34 would extend between these two portions of the hot shoe 24 to electrically isolate the two portions of the hot shoe 24 from one another.

Still referring to FIGS. 13 and 14, the thermoelectric coupling 20 also includes a plurality of heat conducting members 32 disposed between the hot shoe 24 and the cold shoe 28. Heat conducting members 32 are circumferentially spaced within the cavity 56 and extend radially between the outer surface 46 of the hot shoe 24 and the inner surface 52 of the cold shoe 28. Accordingly, heat conducting members 32 are compressed between the hot shoe 24 and the cold shoe 28 in response to greater thermal expansion of the hot shoe 24 relative to the cold shoe 28 during operation of the thermoelectric coupling 20. That is, the hot shoe 24 expands more than the cold shoe 28 during operation of the thermoelectric coupling 20 due to the hot shoe's proximity to the heat source 26 and the cold shoe's proximity to the heat sink 30. Since the cold shoe 28 is disposed outwardly about the hot shoe 24, the plurality of heat conducting members 32 are pressed against the inner surface 52 of the cold shoe 28 when the hot shoe 24 undergoes thermal expansion. Advantageously, this compression increases the structural integrity of the heat conducting members 32 and thus improves the reliability of the thermoelectric coupling 20.

The plurality of heat conducting members 32 illustrated in FIGS. 13 and 14 include at least one positive leg 62 and at least one negative leg 64 that together generate electricity in response to a difference in temperature between the cold shoe 28 and the hot shoe 24. The at least one positive leg 62 may include a plurality of positive legs 62 that are circumferentially spaced from one another and that extend along equally spaced radians that extend perpendicularly with respect to the centerline C. Similarly, the at least one negative leg 64 may include a plurality of negative legs 64 that are circumferentially spaced from one another and that extend along equally spaced radians that extend perpendicularly with respect to said centerline C. In the configuration illustrated in FIG. 14, there are more specifically four negative legs 64 and four positive legs 62 such that the thermoelectric coupling 20 includes a total of eight heat conducting members 32.

The plurality of positive legs 62 and the plurality of negative legs 64 are disposed on opposite sides of the insulating member 34 and thus abut the cold shoe 28 on opposite sides of the annular slot 78. Accordingly, each positive leg 62 of the plurality of positive legs 62 extends radially between the hot shoe 24 and the second portion 88 of the cold shoe 28 and each negative leg 64 of the plurality of negative legs 64 extends radially between the hot shoe 24 and the first portion 86 of the cold shoe 28. Although the positive legs 62 and the negative legs 64 may have a variety of different shapes and sizes, each leg 62, 64 of the plurality of positive legs 62 and the plurality of negative legs 64 may have, without limitation, a rectangular or square cross-section. A square cross-section with sides measuring approximately 3 millimeters (mm) in length is shown in the example illustrated in FIGS. 13 and 14.

The plurality of heat conducting members 32 are at least partially made from a thermoelectric material 22. As shown in FIG. 15A, the at least one positive leg 62 includes a pair of ends 200a, 200b that may be faced with a copper foil 202. A pair of outer layers 204 is disposed at the ends 200a, 200b directly adjacent and inward of the copper foil 202. The pair of outer layers 204 of the at least one positive leg 62 may be made of a material containing titanium. A pair of intermediate layers 206 is disposed directly adjacent and inward of the pair of outer layers 204. The pair of intermediate layers 206 of the at least one positive leg 62 may be made of a material that contains cobalt. A middle layer 208 is disposed between the pair of intermediate layers 206 and the middle layer 208 of the at least one positive leg 62 is made of a thermoelectric material 22 that may be, for example, a material containing skutterudite. As shown in FIG. 15B, the negative leg 64 also includes a pair of ends 210a, 210b that may be faced with a copper foil 202. A pair of outer layers 212 is disposed at the ends 210a, 210b directly adjacent and inward of the copper foil 202. Outer layers 212 of negative leg 64 may be made of a material that contains titanium. A middle layer 214 is disposed between outer layers 212 and the middle layer 214 of negative leg 64 is made of a thermoelectric material 22 that may be, for example, a material containing skutterudite. However, it should be appreciate that the skutterudite material used for negative leg 64 may have a different composition from the skutterudite material used for positive leg 62.

Referring again to FIGS. 13 and 14, the outer surface 46 of the hot shoe 24 includes a plurality of mating surfaces 98 that are circumferentially spaced from one another. The plurality of mating surfaces 98 have a flat shape and abut the plurality of heat conducting members 32. More specifically, the ends 200a, 200b of the positive legs 62 and the ends 210a, 210b of the negative legs 64 include interior ends 200a, 210a and exterior ends 200b, 210b. The interior ends 200a, 210a abut the outer surface 46 of the hot shoe 24 and optionally, the mating surfaces 98, while the exterior ends 200b, 210b abut the inner surface 52 of the first and second portions 86, 88 of the cold shoe 28 respectively. As shown in FIG. 16, multiple thermoelectric couplings 20a, 20b may be arranged adjacent to one another in an abutting end-to-end arrangement to form a thermoelectric module 82. The first portion 86 of the cold shoe 28 of one thermoelectric coupling 20b may be connected to the second portion 88 of the cold shoe 28 of an adjacent thermoelectric coupling 20a such that the multiple thermoelectric couplings 20a, 20b are arranged in series to increase voltage output. Although the multiple thermoelectric couplings 20a, 20b may be connected to one another in various ways, FIG. 16 illustrates directly connecting the cold shoes 28 of adjacent thermoelectric couplings 20a, 20b such that the first end 90 of the cold shoe 28 of one thermoelectric coupling 20b contacts the fourth end 96 of the cold shoe 28 of the adjacent thermoelectric coupling 20a. In FIG. 16, a total of ten thermoelectric couplings 20 are connected together in this manner to yield a total resistance of 21.1 milliohms. In other words, each coupling 20 can generate a resistance of at least 1 milliohm and more preferably at least 2 milliohms.

The thermoelectric coupling 20 of FIG. 13 is preferably manufactured in accordance with the following exemplary method. The method includes the steps of creating a hot shoe 24 of cylindrical shape and a cold shoe 28 of cylindrical shape. In accordance with these steps, the hot shoe 24 may be created with a plurality of mating surfaces 98 that are flat and circumferentially spaced about the hot shoe 24. Also in accordance with these steps, either the hot shoe 24 or the cold shoe 28 is created in two separate portions to define an annular slot 78 therebetween. By way of example and without limitation, the hot shoe 24 is created from a material that contains titanium. Thus, the hot shoe 24 is a material that is, for example, pure titanium, a titanium alloy, or a compound containing titanium as one of its constituents. By way of example and without limitation, the cold shoe 28 is created from a material that contains brass. Thus, the cold shoe 28 is a material that is, for example, one hundred percent brass, an alloy containing brass, or a compound containing brass as one of its constituents.

The method includes the steps of inserting the hot shoe 24 coaxially within the cold shoe 28, creating an insulating member 34 of disc-like shape, and positioning the insulating member 34 in the annular slot 78. In accordance with these steps, a cavity 56 is created between the hot shoe 24 and the cold shoe 28 on opposite sides of the insulating member 34. The method further includes the step of creating a plurality of heat conducting members 32. In accordance with this step, the plurality of heat conducting members 32 created may include at least one positive leg 62 and at least one negative leg 64 and optionally, a plurality of positive legs 62 and a plurality of negative legs 64. The positive leg(s) 62 is created to include: a pair of ends 200a, 200b faced with a copper foil 202, a pair of outer layers 204 disposed at the ends 200a, 200b directly adjacent and inward of the copper foil 202 that are made of a material containing titanium, a pair of intermediate layers 206 disposed directly adjacent and inward of the pair of outer layers 204 that are made of a material that contains cobalt, and a middle layer 208 disposed between the pair of intermediate layers 206 that is made of a thermoelectric material 22 containing skutterudite. The negative leg(s) 64 is created to include: a pair of ends 210a, 210b faced with a copper foil 202, a pair of outer layers 212 disposed at the ends 210a, 210b directly adjacent and inward of the copper foil 202 that are made of a material that contains titanium, a middle layer 214 disposed between the pair of outer layers 212 that is made of a thermoelectric material 22 containing skutterudite.

The method additionally includes the step of positioning the at least one positive leg 62 between the hot shoe 24 and the cold shoe 28 on one side of the annular slot 78 and thus, the insulating member 34, and positioning the at least one negative leg 64 between the hot shoe 24 and the cold shoe 28 on the opposite side of the annular slot 78 and thus, the insulating member 34. Where the at least one positive leg 62 is a plurality of positive legs 62 and where the at least one negative leg 64 is a plurality of negative legs 64, this step includes positioning the plurality of positive legs 62 and the plurality of negative legs 64 circumferentially about the hot shoe 24 so as to create an even spacing between the plurality of positive legs 62 and an even spacing between the plurality of negative legs 64. Optionally, this step may further include aligning the plurality of positive legs 62 and the plurality of negative legs 64 with the plurality of mating surfaces 98 of the hot shoe 24 such that the interior ends 200a, 210a of the plurality of positive legs 62 and the plurality of negative legs 64 abut the mating surfaces 98 of the hot shoe 24.

In accordance with the disclosed method, the plurality of heat conducting members 32 are held in compression between the hot shoe 24 and the cold shoe 28 when heat is applied to the hot shoe 24 forcing the hot shoe 24 to expand at a greater rate than the cold shoe 28 during operation of the thermoelectric coupling 20. Advantageously, the thermoelectric material 22 of the plurality of heat conducting members 32 is less prone to failure as a result of thermal stresses when held in compression such that the durability of the thermoelectric coupling 20 is improved.

Many modifications and variations of the present invention are possible in light of the above teachings and may be practiced otherwise than as specifically described while within the scope of the appended claims. The cross-sectional shape of the thermoelectric device 20 may depart from the circular geometry shown. For example and without limitation, the cross-sectional shape of the thermoelectric device 20 may be an oval, a triangle, a square, a rectangle, or that of any other polygon. The materials noted herein are for example only and the various components of the thermoelectric device 20 may generally be made from other materials than those described in this disclosure. Additionally, the relative size of the various components of the thermoelectric device 20 may differ from that shown in the drawings without departing from the scope of the subject disclosure. Further, any number of thermoelectric devices 20 may be arranged in parallel or in series with one another to form a thermoelectric module 82. Accordingly, the number of thermoelectric devices 20 shown in the Figures is exemplary and is not intended to be limiting. With respect to the methods set forth herein, the order of the steps may depart from the order in which they appear without departing from the scope of the present disclosure and the appended method claims.

What is claimed is:

1. A thermoelectric coupling comprising:
a hot shoe;
a cold shoe extending about said hot shoe;
a plurality of heat conducting members located between said shoes, said members each contain a thermoelectric material and extend outwardly from said hot shoe to said cold shoe such that said plurality of heat conducting members are compressed between said hot shoe and said cold shoe in response to greater thermal expansion of said hot shoe relative to said cold shoe during operation of said thermoelectric coupling;

wherein said cold shoe includes a first portion and a second portion, each having a cylindrical shape, said first portion and said second portion of said cold shoe being aligned with one another and axially spaced to define an annular slot between said first portion of said cold shoe and said second portion of said cold shoe, and peripheries of said first and second portions of said cold shoe having a common diameter with said annular slot being axially located between and axially separating said first and second portions of said cold shoe, said annular slot being on a plane intersecting a centerline axis of said hot shoe; and a first set of said heat conducting members being radially aligned with said first portion of said cold shoe, and a second set of said heat conducting members being radially aligned with said second portion of said cold shoe, and said annular slot also being axially located between and axially separating said first and second sets of said heat conducting members.

2. A thermoelectric coupling as set forth in claim 1 wherein said heat conducting members comprises at least one positive leg extending radially between said hot shoe and said second portion of said cold shoe, and said heat conducting members comprises at least one negative leg extending radially between said hot shoe and said first portion of said cold shoe, said legs being circumferentially spaced apart from each other.

3. A thermoelectric coupling as set forth in claim 1 further comprising:
an insulating member having a disc shape extending radially between said hot shoe and said cold shoe that is positioned axially between said first portion of said cold shoe and said second portion of said cold shoe such that said insulating member is disposed within said annular slot; and
said insulating member also being positioned axially between said first set of said heat conducting members and said second set of said heat conducting members.

4. A thermoelectric coupling as set forth in claim 3 wherein:
said heat conducting members include positive legs and negative legs being disposed on opposite sides of said insulating member;
said heat conducting members comprise skutterudite; and
said insulating member comprises Mica.

5. A thermoelectric coupling as set forth in claim 1 wherein said at least one of said heat conducting members has a rectangular cross-section and has a pair of ends faced with a copper foil, a pair of outer layers disposed at said pair of ends directly adjacent said copper foil that contain titanium, a pair of intermediate layers directly adjacent and inward of said pair of outer layers that contain cobalt, and a middle layer disposed between said pair of intermediate layers that contains skutterudite.

6. A thermoelectric coupling as set forth in claim 1 wherein said heat conducting members each have ends faced with a copper foil, a pair of outer layers disposed at said pair of ends directly adjacent said copper foil that contain titanium, and a middle layer disposed between said pair of outer layers that contains skutterudite.

7. A thermoelectric coupling as set forth in claim 1 wherein said first set of said heat conducting members are circumferentially spaced from one another within a cavity defined between said hot shoe and said cold shoe, and said first set of said heat conducting members are all located on a plane which intersect said centerline axis of said hot shoe.

8. A thermoelectric coupling as set forth in claim 3 wherein:
said hot shoe and said cold shoe are co-axially aligned about said centerline axis; and
said hot shoe continuously axially extends under said first and second sets of heat conducting members, under said first and second portions of said cold shoe and under said insulating member.

9. A thermoelectric coupling as set forth in claim 1 wherein said hot shoe presents an outer surface facing said cold shoe that includes a plurality of mating surfaces that are circumferentially spaced from one another and that have a flat shape to receive said plurality of heat conducting members in an abutting relationship.

10. A thermoelectric coupling as set forth in claim 1 wherein said hot shoe has a cylindrical shape and contains titanium and said cold shoe has a cylindrical shape and contains brass.

11. A thermoelectric coupling as set forth in claim 1 wherein multiple ones of said thermoelectric coupling are arranged adjacent to one another in an abutting end-to-end arrangement to form a thermoelectric module.

12. A thermoelectric coupling comprising:
a heat receiving structure disposed adjacent a heat source;
a heat sink comprising radially projecting fins;
a heat dissipating structure coupled to said heat sink;
at least one heat conducting member extending radially between said heat receiving structure and said heat dissipating structure that thermally couples said heat receiving structure and heat dissipating structure, said at least one heat conducting member being a semiconductor;
said heat dissipating structure extending annularly about said heat receiving structure forming an annular cavity between said heat receiving structure and said heat dissipating structure wherein said at least one heat conducting member is disposed within said annular cavity and is radially compressed between said heat receiving structure and said heat dissipating structure in response to greater thermal expansion of said heat receiving structure relative to said heat dissipating structure;
at least one compression member located circumferentially about said heat dissipating structure that applies additional radial compression to said at least one heat conducting member by compressing said heat dissipating structure radially inwardly toward said heat receiving structure;
a slot being located between and axially separating portions of said heat dissipating structure; and
an internal combustion engine-exhaust pipe located within and contacting said heat receiving structure.

13. A thermoelectric coupling as set forth in claim 12 wherein:
said at least one heat conducting member generates electricity in response to temperature differences between said heat receiving structure and said heat dissipating structure;
said portions of said heat dissipating structure are each cylindrical and coaxial with said at least one heat receiving structure; and
said heat receiving structure is cylindrical and continuously axially extends under multiples of said at least one heat conducting member, under said portions of said heat dissipating structure.

14. A thermoelectric coupling as set forth in claim 12 wherein said at least one heat conducting member comprises at least one positive leg extends radially between said hot shoe and said second portion of said cold shoe, said at least one heat conducting member comprises at least one negative leg extends radially between said hot shoe and said first portion of said cold shoe, and at least some of said legs being axially spaced apart from each other and separated by said slot.

15. A thermoelectric coupling as set forth in claim 12 further comprising:
an insulating member having a disc shape extending radially between said heat receiving structure and said heat dissipating structure, and said insulating member being positioned axially between said portions of said heat dissipating structure such that said insulating member is disposed within said slot which is an annular slot defining a plane perpendicular to a centerline of said heat receiving structure.

16. A thermoelectric coupling as set forth in claim 12 wherein said at least one heat conducting member is a plurality of heat conducting members which are circumferentially spaced from one another within said cavity defined between said structures.

17. A thermoelectric coupling as set forth in claim 12 wherein:
said structures are co-axially aligned about a centerline;
said at least one compression member comprises metallic foil;
said heat dissipating structure comprises brass; and
said at least one heat conducting member is a plurality of heat conducting members which each comprise cobalt and antimony.

18. A thermoelectric coupling as set forth in claim 12 wherein:
said at least one heat conducting member at least partially comprises skutterudite; and
said structures are at least partially comprised of titanium.

19. A thermoelectric coupling as set forth in claim 12 further comprising:
an insulator within said slot comprises Mica; and
said at least one heat conducting member comprises skutterudite.

20. A thermoelectric apparatus comprising multiple thermoelectric generators in contact with a heat source, each of said thermoelectric generators comprising:
(a) a hot shoe disposed adjacent said heat source, said hot shoe comprising Titanium;
(b) a cold shoe disposed adjacent a heat sink, said cold shoe comprising Titanium or Brass;
(c) at least one semi-conductor extending between said hot shoe and said cold shoe that thermally couples said hot shoe and cold shoe, and that generates electricity in response to a temperature difference between said hot shoe and said cold shoe;
(d) at least one metallic compression member located about an outer diameter of said cold shoe that applies compression to said at least one semi-conductor by compressing said cold shoe inwardly toward said hot shoe;
(e) said cold shoe being located about said hot shoe such that expansion of said hot shoe during heating exceeds expansion of said cold shoe and compresses said at least one semi-conductor between said hot shoe and said cold shoe during operation of said thermoelectric device;
(f) said at least one semi-conductor at least partially comprising skutterudite;
(g) said hot shoe and said cold shoe being cylindrical and coaxial, and one of said shoes having a greater axial dimension than the other of said shoes for each of said thermoelectric generators; and
(h) an electrical circuit wired in series with said multiple thermoelectric generators.

21. An apparatus as set forth in claim 20 wherein said hot shoe has a cylindrical shape with a central bore therein and said cold shoe has a cylindrical shape that is located annularly about and co-axially with said hot shoe to define an annular cavity between said hot shoe and said cold shoe within which is located said at least one semi-conductor.

22. An apparatus as set forth in claim 20 further comprising:
an insulator being on a plane intersecting a centerline axis of said hot shoe; and
said cold shoe including a first portion and a second portion which are axially spaced from each other, peripheries of said first and second portions of said cold shoe having a common diameter, and said insulator being axially located between and axially separating said first and second portions of said cold shoe.

23. An apparatus as set forth in claim 22 wherein a first set of said at least one semi-conductor is radially aligned with said first portion of said cold shoe, and a second set of said at least one semi-conductor is radially aligned with said second portion of said cold shoe, with said insulator also being axially located between and axially separating said first and second sets of said semi-conductors.

24. An apparatus as set forth in claim 20 wherein said at least one semi-conductor includes a positive leg and a negative leg spaced apart from each other with a gap therebetween.

25. An apparatus as set forth in claim 20 further comprising a disc shaped insulating member disposed adjacent said at least one semi-conductor that extends between said hot shoe and said cold shoe.

26. An apparatus as set forth in claim 20 wherein said at least one compression member at least partially comprises a metallic foil.

27. An apparatus as set forth in claim 20 further comprising a slot, which is annular, being located between and axially spacing apart peripheral cylindrical surfaces of said cold shoe.

28. A thermoelectric apparatus as set forth in claim 20 further comprising an exhaust pipe of an internal combustion engine located within and contacting said hot shoe.

* * * * *